United States Patent [19]
Heselton

[11] Patent Number: 6,147,878
[45] Date of Patent: Nov. 14, 2000

[54] SECURE LATCH LOCKING CLIP

[75] Inventor: Donald E. Heselton, East Kingston, N.H.

[73] Assignee: Lucent Technologies Inc., Murray Hill, N.J.

[21] Appl. No.: 09/257,846

[22] Filed: Feb. 25, 1999

[51] Int. Cl.[7] .................................................. H05K 7/14
[52] U.S. Cl. ..................... 361/798; 361/754; 361/756; 361/759; 361/801; 361/802
[58] Field of Search ..................... 361/754–759, 361/798, 800, 801, 802; 200/335

[56] References Cited

U.S. PATENT DOCUMENTS

| 4,064,551 | 12/1977 | Lightfoot | 361/399 |
|---|---|---|---|
| 4,301,494 | 11/1981 | Jordan | 361/801 |
| 4,569,001 | 2/1986 | Beun | 361/798 |
| 5,191,970 | 3/1993 | Brockway et al. | 200/335 |
| 5,373,133 | 12/1994 | Brockway et al. | 200/335 |
| 5,504,456 | 4/1996 | Joist | 361/754 |

*Primary Examiner*—Jeffrey Gaffin
*Assistant Examiner*—Tuan Dinh
*Attorney, Agent, or Firm*—Joseph E. Funk

[57] ABSTRACT

A locking clip is disclosed for use with modular circuit packs that mount in mounting racks, and the insertion and extraction of circuit packs from a mounting rack is facilitated using a lever that is attached to the face plate of each circuit pack. When the novel locking clip is installed in a hole through the lever it is difficult to be seen and can only be removed with tweezers or similar small grasping tool. When in place the locking clip blocks the normal operation of the lever and the circuit pack cannot be removed from the mounting rack. Removal of the locking clip permits the lever to be operated normally to remove a circuit pack from the mounting rack.

17 Claims, 2 Drawing Sheets

SECURE LATCH LOCKING CLIP

FIELD OF THE INVENTION

This invention relates generally to modular circuit packs having an external lever attached thereto and used for both inserting the packs into a mounting rack and releasing the packs from the mounting rack. The invention relates more specifically to a small locking clip that is used to temporarily prevent the external lever from being usable to remove a circuit pack from a mounting rack.

BACKGROUND OF THE INVENTION

Modular circuit packs and mounting racks into which the packs are inserted for storage or for use in a system are well-known in the prior art. Also well-known are a lever attached to the edge of the circuit packs that are used while inserting a circuit pick into a mounting rack, and also used for releasing and extracting the circuit pack from a mounting rack. The lever is used to apply insertion force to a circuit pack to insure that it is properly seated in a mating electrical connector in the mounting rack. The levers is also used to apply a force to extract a circuit pack from the mating electrical connector in the mounting rack. By the use of this lever damage to circuit packs caused during insertion or extraction is minimized or eliminated.

There are many system applications where mounting racks with inserted circuit packs are utilized, but the mounting racks are located where they can be accessed by unauthorized personnel. When problems arise which may or may not be caused by a circuit pack, unauthorized personnel sometimes attempt to fix the problems but too often only cause further problems. In addition. open mounting racks with circuit packs inserted therein are oftentimes displayed at trade shows and demonstrations. Too often these circuit packs disappear, or people extract them from the mounting rack to inspect the packs and they inadvertently damage sensitive micro-circuits mounted on the circuit packs by static electricity.

SUMMARY OF THE INVENTION

Thus, there is a need in the prior art for a simple, inexpensive way to lock circuit packs in mounting racks so that they cannot be removed from the rack by unauthorized personnel using their insertion/extraction lever.

This need in the prior art is met by the present invention. A small locking clip is provided which is quickly and easily inserted from the front side of a circuit pack and prevents the circuit pack insertion/extraction lever from being actuated to remove the pack from a mounting rack.

After the locking clip is inserted it is not readily noticeable and can only be removed with a pair of tweezers or another similar small tool.

It is a feature of the invention that the locking clip can be utilized with existing circuit packs having insertion/extraction levers.

It is another feature of the invention that the locking clip is small and easy to manufacture.

It is yet another feature of the invention that when the locking clip is being used to lock the insertion/extraction lever of a circuit pack it is almost invisible.

It is still another feature of the invention that the locking clip cannot be removed without the use of a pair of tweezers or another similar small tool.

DESCRIPTION OF THE DRAWING

The invention will be better understood upon reading the following Detail Description in conjunction with the drawing in which.

DETAILED DESCRIPTION

Figure 1:
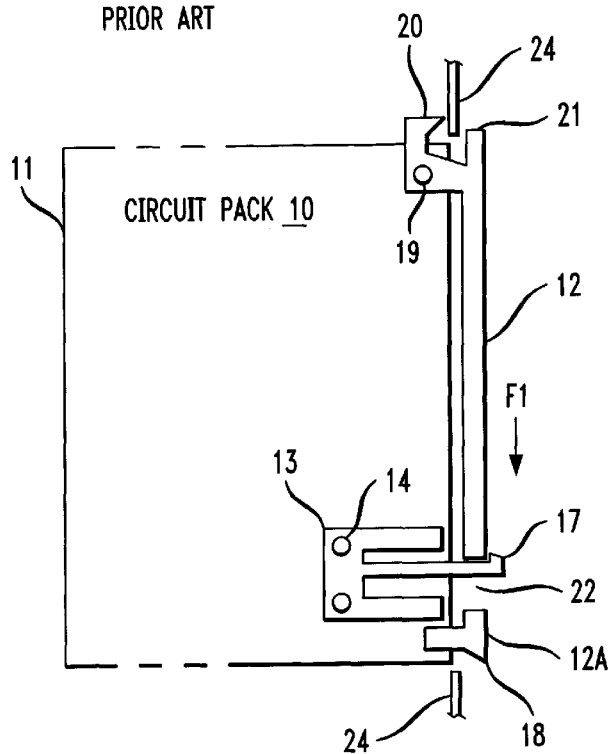
FIG. 1 shows a prior art circuit pack inserted into a mounting rack with its insertion/extraction lever shoen in its stored position.
Figure 1B:
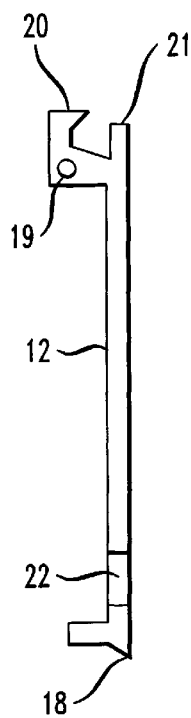
FIG. 1B shows an insertion/extraction lever.
Figure 2:
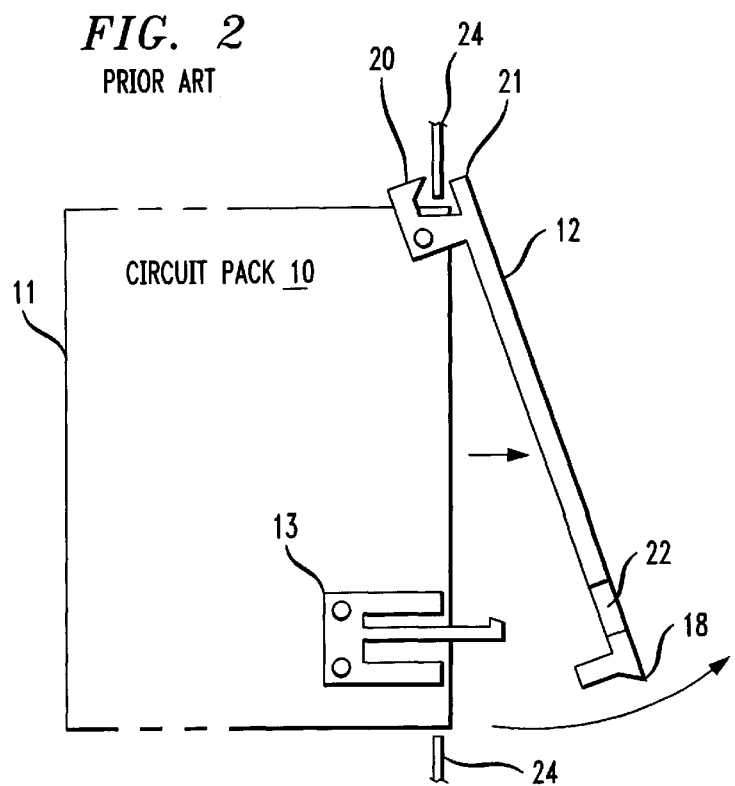
FIG. 2 shows the prior art circuit pack with its insertion/extraction lever in use to extract the circuit pack from a mounting rack.
Figure 3:
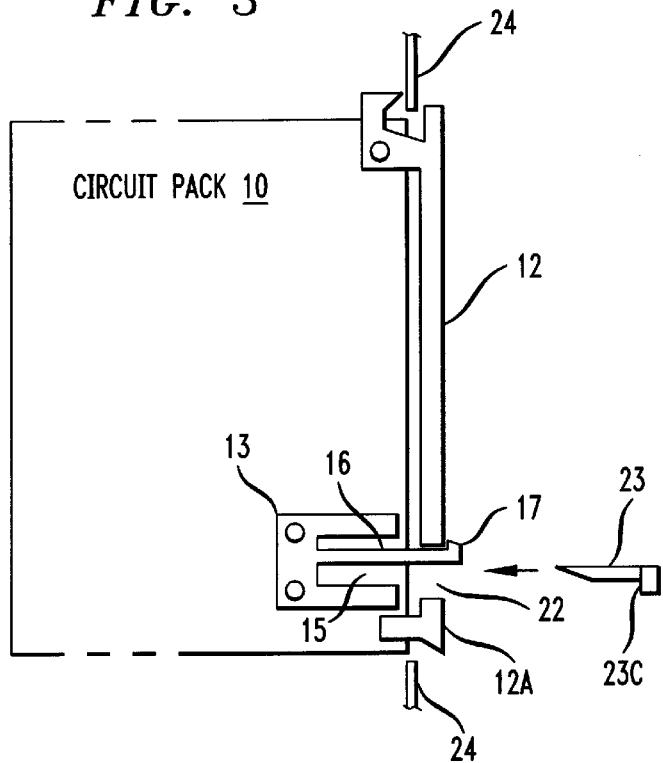
FIG. 3 is the same as FIG. 1 but shows the novel locking clip about to be inserted.
Figure 5:
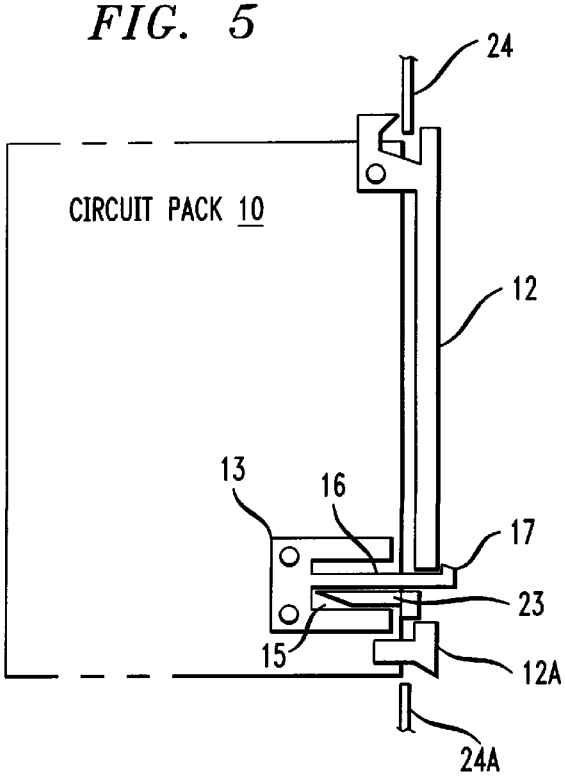
FIG. 5 is the same as FIG. 1 but shows the novel locking clip fully inserted to prevent the use of the insertion/extraction lever to remove a circuit pack from a mounting rack.

In FIGS. 1 and 2 are shown a prior art circuit pack 10 inserted into a prior art mounting rack. Very few details of the mounting rack are shown in these Figures because they are so well-known in the prior art, and so as not to detract from the presentation of the present invention. For example, electrical connectors in the rear of a mounting rack are not shown, top and bottom edge guides in which circuit packs are slid are not shown, and details of the front plate of the mounting rack are not shown. In addition, no circuitry is shown on the representative circuit packs, and no rear edge electrical connectors on the circuit packs are shown. Details of the insertion/extraction mechanism for one type of circuit pack are shown in detail because it is with such mechanisms that the present invention works, and only a small portion of the front panel of the mounting rack is shown with which the insertion/extraction mechanism functions. In addition, FIGS. 1, 3 and 5 are shown as side cutaway views to better show how parts fit together and interact. Thus, in FIGS. 1, 3 and 5 lever 12 is shown having its main upper part 12, above a hole 22, and a lower part 12a below hole 22 appearing as two separate parts, but they are really one lever 12 as shown in FIGS. 1B and 2.

In FIG. 1 is shown a simplified prior art circuit pack 10 with which the novel locking clip functions. On circuit pack 10 is typically mounted a number of electronic components (not shown). A circuit pack 10 is inserted into an open slot (not shown) of a mounting rack, and at the rear of each slot is an electrical connector (not shown) into which mating electrical connectors (not shown) on end 11 of circuit pack 10 are inserted in a mating engagement in a matter well-known in the art. The mounting rack (not shown) has a front surface 24 (shown only partially) through which circuit packs 10 are inserted into slots in the mounting rack, and with the edge of which the circuit pack levers cooperate to insert/extract the circuit packs 10. This insertion/extraction operation is described in greater detail further in this Detailed Description.

Attached to circuit pack 10 is a closure clip 13 as shown. Closure clip 13 is also shown and described in greater detail with reference to FIG. 1B. Clip 13 is made of a durable, flexible material, such as nylon, and is used to hold a lever 12 in the position shown in FIG. 1. This is accomplished by a hook end 17 of closure clip 13 which extends through a hole 22 through lever 12 and catches the outer surface of lever 12 so that lever 12 cannot be lifted upward to extract circuit pack 10 from the mounting rack until hook end 17 is moved out of the way by an externally applied force F1. Closure clip 13 has two holes 14 there through that are used to fasten clip 13 to the edge of circuit pack 10 as shown using rivets (not shown).

Lever 12 is rotatably fastened to circuit pack 10 by a pin 19. Lever 12 is shown and described in greater detail with reference to FIG. 1B. As is seen in FIG. 1 there is a top portion 21 of lever 12 that is located outside of mounting rack front plate 24 when circuit pack 10 is fully inserted into the mounting rack. To remove circuit pack 10 from the mounting rack, a downward force F1 is applied to hook end 17 of clip 13 to move flexible hook end 17 downward away from the edge of hole 22 through lever 12. In this matter lever 12 is released and an outward force can be applied to lower end 18 of lever 12 that will swing lever 12 outward and upward as shown in FIG. 2. As lever 12 is rotated outward its upper element 21 pushes against the front of plate 24 of the mounting rack thereby creating a camming force which helps extract circuit pack 10 from the electrical connector in the rear of the mounting rack. When circuit pack 10 is inserted into the mounting rack, lever 12 is first rotated outward as shown in FIG. 2. This provides clearance for upper element 20 of lever 12 to pass inside the mounting rack as circuit pack 10 is inserted and initially engages the electrical connector at the rear of the mounting rack. As lever 12 is rotated downward its upper element 20 contacts the inner surface of front plate 24 of the mounting rack and thereby creates a camming force to fully seat the electrical contacts (not shown) on end 11 of circuit pack 10 into full engagement with mating electrical contacts (not shown) located at the rear of the mounting rack. Lever 12 is then rotated downward until it is locked by hook end 17 of closure clip 13 as shown a FIG. 1.

Figure 1A:
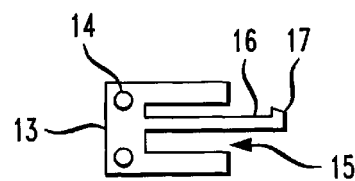
FIG. 1A shows a small molded part that is mounted on a circuit pack and is used to hold the insertion/locking lever in its stored position.

FIG. 1A shows closure clip 13 by itself for ease of understanding. Clip 13 is made of a durable, flexible material, such as nylon because it has an arm 16 with locking hook 17 that must be capable of being flexed many times without breaking as circuit pack 10 is repeatedly inserted into and extracted from a mounting rack. Flexible arm 16 extends beyond the main portion of clip 13, as shown, so that it can extend through hole 22 through lever 12 as shown in FIGS. 1, 3 and 5. The top surface of locking hook 17 has a slanted surface which permits arm 16 to be deflected downward as lever 12 is lowered into its normally closed position, and locking hook 17 passes through hole 22 in lever 12. As locking hook 17 passes completely through hole 22, arm. 16 is able to move upward and hook 17 again catches the edge of hole 22 through lever 12 as shown in FIGS. 1, 3 and 5.

There is a space 15 below flexible arm 16 that is utilized to implement the teaching of the present invention. The secure latch locking clip 23 of the present invention is shown and described in detail with reference to FIGS. 3–6.

FIG. 1B shows insertion/extraction lever 12 by itself. Lever 12 has a hole 19 that is used to rotatably fasten the lever to circuit pack 10 as shown in FIGS. 1, 2, 3 and 5, in a manner well-known and art. Lever 12 also includes upper end elements or extensions 20 and 21 which are respectively used to provide an insertion camming force and an extraction camming force to circuit pack 10 as previously described. Lever 12 also has a hole 22 through its lower end through which arm 16 of closure clip 13 passes when lever 12 is rotated into its normally closed position as shown in FIGS. 1, 3 and 5.

FIG. 2 is the same as FIG. 1 except lever 12 has been released by depressing locking hook 17 of closure clip 13 downward, as previously described, until its locking hook 17 clears the top edge of hole 22, and lever 12 is shown swung part way outward and upward. In this position upper element 21 of lever 12 is camming against the outer surface 24 of the mounting rack and is pulling circuit pack 10 in the direction of the arrow, out of the mounting rack until the circuit pack 10 edge connector (not shown) is disconnected from the mating connector (not shown) at the rear of the mounting rack. Circuit pack 10 is then manually withdrawn the remainder of the way from the mounting rack. When circuit pack 10 is inserted into the mounting rack, lever 12 is first rotated outward as shown in FIG. 2. This provides clearance for upper element 20 of lever 12 to pass inside the mounting rack as circuit pack 10 is inserted and initially engages the electrical connector at the rear of the mounting rack. As lever 12 is rotated downward its upper element 20 contacts the inner surface of front plate 24 of the mounting rack and thereby creates a camming force to fully seat the electrical contacts (not shown) on end 11 of circuit pack 10 into full engagement with mating electrical contacts (not shown) located at the rear of the mounting rack. Lever 12 is then rotated downward until it is locked by hook end 17 of closure clip 13 as shown a FIG. 1.

FIG. 3 is the same as FIG. 1, showing circuit pack 10 fully inserted into the mounting rack and lever 12 fully lowered to its normally closed position as has been previously described with reference to FIG. 1. In this position space 15 under flexible arm 16 of closure clip 13 (described with reference to FIG. 1A) is in coaxial alignment with hole 22 through lever 12. It is into these two coaxially aligned spaces that the novel locking clip 23 of the present invention is inserted as indicated by the arrow adjacent to hole 22. Locking clip 23 is shown and described in detail with reference to FIG. 4 in the next paragraph.

Figure 4:
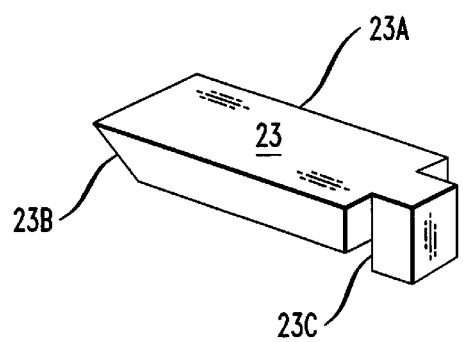
FIG. 4 is a three-dimensional view of the novel locking clip, showing it in greater detail.

FIG. 4 shows an isometric view of locking clip 23 in accordance with the teaching of the preferred embodiment of the invention. Clip 23 has a forward portion 23A which has a tapered end 23B. Tapered end 23B aids in the insertion of locking clip 23 below arm 16 of closure clip 13 and into space 15 of closure clip 13. Locking clip 23 also has a rear portion 23C that is narrower than forward portion 23A to aid in removal of closure clip 13. However, rear portion 23C extends downward more than forward portion 23A and is used to set the maximum distance that locking clip 23 may travel into space 15 in closure clip 13. When locking clip 23 has been inserted into space 15 below arm 16 of closure clip 13, and it is then desired to remove locking clip 23, small tweezers are used to grasp the narrower sides of rear portion 23C and pull clip 23 from beneath arm 16. This operation is better seen and described with reference to FIGS. 5 & 6.

FIG. 5 is the same as FIG. 3 except locking clip 23 is shown fully inserted through hole 22 and into space 15 below arm 16 of closure clip 13. When locking clip 23 is fully inserted, as shown in FIG. 5, it is very unobtrusive and is basically seen only by persons knowing where to look and knowing what to look for. In addition, it can be seen that rear end 23C of locking clip 23 prevents it traveling any further into space 15 below arm 16 than shown in FIG. 5. When locking clip 23 is in place, as shown. it prevents a downward force on hook end 17 of arm 16 of closure clip 13 from deflecting arm 16 downward so that hook end 17 clears the upper edge of lever 12 and permits the lever to be rotated outward to extract circuit pack 10 from the mounting rack as previously described with reference to FIG. 2.

A pair of tweezers, or similar small grasping tool (not shown), must be used to reach in through the lower part of hole 22 through lever 12 and under arm 16 to grasp either side of rear portion 23C of locking clip 23. With the tweezers holding locking clip 23 it is extracted. With locking clip 23 extracted, lever 12 can again be released to remove circuit card 10 from the mounting rack as has been described with reference to FIG. 2.

Figure 6:
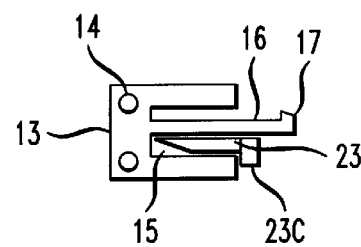
FIG. 6 is the same as FIG. 1 B but showing the novel locking clip inserted in the small molded part.

FIG. 6 shows only closure clip 13 with locking clip 23 inserted into space 15 below arm 16 for ease in understanding how locking clip 23 blocks any downward motion of arm 16 of closure clip 13. As described in the previous and other paragraphs this prevents any downward motion of hook end 17 from releasing lever 12 to rotate and extract circuit pack 10.

While what has been described hereinabove is the preferred embodiment of the invention it will be obvious to those skilled in the art that numerous changes may be made without departing from the spirit and scope of the invention. For example, different types of circuit packs in the prior art utilize other insertion/extraction camming lever arrangements with which a locking clip may be utilized to prevent operation of the levers.

What is claimed is:

1. Locking apparatus for use with a modular circuit pack that mounts in a mounting rack and its insertion into and extraction from the mounting rack is facilitated using a lever that is attached to the face end of said circuit pack, said lever being in a first position when said circuit pack is fully inserted into said mounting rack and said lever is moved to a second position to facilitate removing said circuit pack from said mounting rack, said locking apparatus comprising:

first means that is movable between a first position and a second position, when said first means is in its first position it holds said lever in its first position, and said first means must be moved to its second position before said lever can be moved to its second position to facilitate removing said circuit pack from said mounting rack; and a locking clip that cooperates with said first means to prevent the movement of said first means from its first position to its second position, thereby preventing the removal of said circuit pack from said mounting rack.

2. The invention in accordance with claim 1 wherein said first means comprises:

a flexible first portion that is moved between said first position and said second position of said first means; and a hook end connected to said flexible first portion that is moved between said first position and said second position of said first means as said flexible first portion is moved, said hook end preventing said lever from moving from its said first position to its said second position until said hook end is moved to its said second position.

3. The invention in accordance with claim 2 wherein said flexible first portion of said first means is normally in said first position of said first means and said first means further comprises a wall means that limits the travel of said flexible first portion in the direction of said second position of said first means.

4. The invention in accordance with claim 3 wherein said locking clip is inserted between said wall means and said flexible first portion of said first means when it is desired to prevent the movement of said flexible first portion of said first means from its first position to its second position and thereby prevent removal of said circuit pack from said mounting rack.

5. The invention in accordance with claim 4 wherein said lever has a hole through which said hook end protrudes when said lever is in its first position, and when said first means is in its first position said hook end prevents said first lever from moving to its said second position.

6. The invention in accordance with claim 5 wherein said locking clip is inserted through said hole in said lever to be between said wall means and said flexible first portion of said first means to prevent the removal of said circuit pack from said mounting rack, said locking clip in this position being hard to see and requiring a tool to remove same.

7. The invention in accordance with claim 6 wherein said locking clip comprises:

a first portion that is inserted between said wall means and said flexible first portion of said first means to prevent the movement of said flexible first portion of said first means to its second position and thereby prevent the removal of said circuit pack from said mounting rack.

8. The invention in accordance with claim 7 wherein said locking clip further comprises:

a second portion that has a first dimension that does not permit said second portion to pass into the space between said wall means and said flexible portion of said first means and thereby limit the distance said locking clip can travel into said space.

9. The invention in accordance with claim 8 wherein said second portion of said locking clip has a second dimension that permits said locking clip to be grasped using said tool and removed from said space between said wall means and said flexible portion of said first means.

10. A method for preventing removal of a modular circuit pack from a mounting rack in which said pack is mounted, and said pack being normally inserted into and extracted from the mounting rack using a lever that is attached to the face end of said circuit pack, said lever being in a first position when said circuit pack is fully inserted into said mounting rack and said lever is moved to a second position to facilitate removing said circuit pack from said mounting rack, and a flexible element on said circuit pack in a first position engages said lever to hold it in its first position until the flexible element is moved to a second position, said method comprises the step of:

preventing said lever from being moved from its first position to its second position until it is desired to move said lever to its said second position to remove said circuit pack from said mounting rack by inserting a locking clip adjacent to said flexible element that prevents said flexible element from moving from its first position and thereby preventing said lever from being moved to its second position to extract said circuit card from said mounting rack.

11. The method in accordance with claim 10 wherein said step of preventing said lever from being moved further comprises the step of:

extracting said locking clip from adjacent to said flexible element and thereby permit said flexible element to be moved to its second position, thereby permitting said lever to be moved from its first position to its second position to facilitate extraction of said circuit card from said mounting rack.

12. The method in accordance with claim 10 wherein said locking clip is inserted adjacent to said flexible element only so far as to be slightly recessed behind said lever, but being removable therefrom by the aid of a tool.

13. Locking apparatus for use with a modular circuit pack that mounts in a mounting rack and its insertion into and extraction from the mounting rack is facilitated using a lever that is attached to the face end of said circuit pack, said lever being in a first position when said circuit pack is fully inserted into said mounting rack and said lever is moved to a second position to facilitate removing said circuit pack from said mounting rack, a closure means is attached to said circuit pack, said closure means being movable between a first and a second position, when said closure means is in its said first position it holds said lever in its said first position, and said closure means must be moved to its second position before said lever can be moved to its said second position to facilitate removing said circuit pack from said mounting rack, said locking apparatus comprising:

a locking clip that cooperates with said closure means to prevent its movement from its first position to its second position, thereby preventing the movement of said lever to facilitate removal of said circuit pack from said mounting rack.

14. The invention in accordance with claim 13 wherein said closure means has a flexible first portion that is moved between said first position and said second position, and a hook end connected to said flexible first portion that is moved between said first position and said second position as said flexible first portion is moved, said hook end preventing said lever from moving from its first position to its second position until said hook end is moved to its second position, said closure means has a wall means that limits the travel of said flexible first portion toward said second position of said closure means, and wherein said locking clip is inserted between said wall means and said flexible first portion of said closure means when it is desired to prevent the movement of said flexible first portion of said closure means from its first position to its second position and thereby prevent removal of said circuit pack from said mounting rack.

15. The invention in accordance with claim 14 wherein said locking clip comprises:

a first portion that is inserted between said wall means and said flexible first portion of said closure means to prevent the movement of said flexible first portion of said closure means to its second position and thereby prevent the removal of said circuit pack from said mounting rack.

16. The invention in accordance with claim 15 wherein said locking clip further comprises:

a second portion that has a first dimension that does not permit said second portion to pass into the space between said wall means and said flexible portion of said closure means and thereby limiting the distance said locking clip can travel into said space.

17. The invention in accordance with claim 16 wherein said second portion of said locking clip has a second dimension that permits said locking clip to be grasped using a tool and removed from said space between said wall means and said flexible portion of said closure means so that said lever can be used to facilitate the removal of said circuit pack from said mounting rack.

* * * * *